United States Patent [19]

Rice

[11] 4,002,274

[45] Jan. 11, 1977

[54] PARTICULATE MATERIAL FEEDER FOR HIGH TEMPERATURE VACUUM

[75] Inventor: Dale W. Rice, Horseheads, N.Y.

[73] Assignee: Corning Glass Works, Corning, N.Y.

[22] Filed: Dec. 22, 1975

[21] Appl. No.: 643,349

Related U.S. Application Data

[62] Division of Ser. No. 537,042, Dec. 27, 1974, Pat. No. 3,960,503.

[52] U.S. Cl. .............................. 222/410; 222/285
[51] Int. Cl.² ................... B65G 65/48; G01F 11/20
[58] Field of Search ........... 222/285, 286, 410, 414

[56] References Cited

UNITED STATES PATENTS

| | | | |
|---|---|---|---|
| 689,540 | 12/1901 | Colomy | 222/410 X |
| 816,775 | 4/1906 | Brauer | 222/410 X |
| 1,582,009 | 4/1926 | Hand et al. | 222/285 X |
| 2,692,702 | 10/1954 | Church | 222/410 X |
| 2,933,219 | 4/1960 | Taniyama et al. | 222/285 X |
| 3,540,604 | 11/1970 | Hyttinen | 222/410 X |

Primary Examiner—Robert B. Reeves
Assistant Examiner—David A. Scherbel
Attorney, Agent, or Firm—Richard N. Wardell; Clarence R. Patty, Jr.

[57] ABSTRACT

Feeder mechanism, suitable for use in a high-temperature furnace, comprises a rotatable, height-adjustable flat disc located axially below an outlet of a particulate raw material hopper and above (or within) but mounted on a rotatable funnel. Upon rotation of the disc and funnel, particulate raw material is gravity fed from the hopper onto the disc, then falls off the edge of the disc at a constant rate and is caught by the funnel which transports the raw material to a processing area, e.g. a crystal growing furnace, outside of the high-temperature furnace. A motor-driven, magnetically coupled mechanism for rotating the disc and funnel, and a threaded rod combined with nuts (along with bellows) for adjusting the separation between the disc and the hopper outlet (to control flow rate of the raw material), are provided outside of the space, e.g. high-temperature furnace, in which the combined hopper-disc-funnel are located.

3 Claims, 4 Drawing Figures

PARTICULATE MATERIAL FEEDER FOR HIGH TEMPERATURE VACUUM SYSTEM

RELATED APPLICATION

This is a division of application Ser. No. 537,042, filed Dec. 27, 1974 and now U.S. Pat. No. 3,960,503.

BACKGROUND OF THE INVENTION

Techniques and apparatus for pulling single crystal bodies from a melt of the material have been known for some time and are constantly being improved. Bodies such as sapphire tubing drawn from a melt of alpha-alumina or semiconductor articles drawn from silicon or germanium melts are examples of industrial use of such apparatus and Technique. Typical furnaces for growing crystals from the melt are shown in U.S. Pat. Nos. 3,471,266 and 3,679,370, for example.

Inherent in the process of crystallizing from the melt is the need to replenish the melt batch as it is depleted. However, several problems which are variously found in prior art apparatus must be overcome in order to effectively supply the system with batch material. One problem is that the melt, which is held in a crucible in the crystal growing furnace, must be maintained at a very constant temperature for good crystal growth. New batch material must therefore be delivered at a constant rate to avoid wide flucuations in temperature in the crucible with each entry of make-up material. The temperature of the batch material may also be raised by pre-heating to avoid introducing large temperature gradients due to large temperature differences between batch and melt.

A second problem is one of contamination of the make-up material before its addition to the crucible. Poor ware is inevitable if the raw batch picks up impurities in the air and carries them to the crucible. For example, when pulling sapphire tubing, the α-alumina batch may pick up water from the air, which if present in the melt, can cause excessive voids in the tubing.

The answer to the second problem may bring on the third problem. To avoid the impurities, the batch material may be heated in an air-evacuated preheating furnace independent of, but in communication with, the crystal growing furnace. The batch material is placed in the preheat furnace, the temperature is raised, and the furnace is outgassed and optionally backfilled with an inert atmosphere.

The problem brought on by the addition of a preheat furnace in the system is that the material must now be transported from the preheat furnace at a constant and uniform rate to the crucible in the crystal growing furnace, the whole system being maintained gas-tight. The feeder mechanism must now also apparently operate in a high-temperature environment, one not conducive to the long life and efficient operation of feeder moving parts and especially of bearings which may generally be necessary between moving parts.

SUMMARY OF THE INVENTION

It is therefore an object of the present invention to provide a feeder mechanism which delivers particulate raw material from a supply hopper at a constant, uniform delivery rate and which may be adjusted to accommodate different raw materials, particle sizes and rates of delivery.

In accordance with the first objective, the invention provides a gravity feeder comprising a raw material hopper having an inlet opening at the top for receiving raw material and a small cross-sectional area outlet opening at the bottom for discharging raw material, a rotatable metering means having a flat upper surface positioned at a distance below the hopper outlet opening and being of such size and distance below the outlet opening that, when not rotating, the hopper raw material falls to and accumulates on the flat upper surface but does not flow past the metering means, but when rotating, the hopper raw material falls to the flat upper surface and flows steadily to the edge of the flat upper surface where it constantly falls past the metering means, an open-ended receiving means below the metering means for catching the metered raw material and transporting it to a processing area, and a means for rotating the metering means. In a crystal growing furnace, the material would be transported directly or indirectly to the melt in the crucible.

The preferred feeder in a sapphire crystal growing apparatus includes: a generally conical raw material hopper having an axial outlet opening at the bottom, a rotatable funnel receptacle below and concentric with the outlet opening of the hopper and adapted to receive and transport metered raw material, a sapphire disc positioned concentrically within the rotatable funnel and mounted on a metal support which is in turn fixed to the rotatable funnel receptacle wall for rotation therewith and means for rotating the funnel. The rotatable funnel is vertically positionable to increase or decrease the spacing between the sapphire disc and the outlet opening.

A second object of the present invention is to provide a particle feeding mechanism in a high temperature vacuum furnace without the use of friction bearings in the hot furnace cavity.

In accordance with the second objective, the invention provides a funnel rotation and height adjustment means separated from the feeder mechanism and below the preheat furnace cavity. The feeder mechanism is located in the preheat furnace above the furnace bottom plate while the downwardly extending funnel conduit or a tubular extension of the funnel conduit extends through an opening in the furnace bottom. Appropriate use of heat shields and water cooling on the furnace bottom plate keep the space below the furnace from becoming excessively hot.

Immediately below the opening in the furnace bottom is an upper bellows communicating with the rotational means, followed by a lower bellow means between the rotational means and the crystal growing furnace. Both furnaces, as well as all seals between the furnaces, bellows, and rotational means are gas-tight, preferably through the use of metals or elastomer O-ring seals, so that the entire assembly may be air evacuated by means of vacuum pumps communicating with the crystal growing furnace and the preheat furnace. A gate valve may be located between the two furnaces so that they may be independently evacuated.

The rotational means itself comprises a vertically disposed open-ended cylinder sealed at its upper and lower ends to the upper and lower bellows, respectively. The funnel conduit or tubular extension of the funnel conduit passes axially through the cylinder and is vertically positioned and rotatably mounted therein by means of a pair of bearings. Rotation is provided by a rotary coupling of concentric sleeve magnets, one fixed to the conduit or tubular extension in a closely spaced apart, concentric relationship with the inner wall of the open-ended cylinder, and the second magnet rotatably mounted in a closely spaced apart, concentric relationship with the outer wall of the open-ended cylinder at about the same height as the inner magnet, so that as the outer ring magnet is rotated (e.g. by means of a motor), the inner ring magnet responds with similar rotation, thereby rotating the funnel and disc attached thereto. Alternative means of rotation may be provided by a special motor, the rotor of which is mounted on the funnel conduit inside the open-ended cylinder and the stator of which is mounted outside of the cylinder in the place of the rotatably mounted second magnet in the concentric sleeve coupling.

DETAILED DESCRIPTION OF THE INVENTION

The present invention is a particulate raw material feeder apparatus for use in high temperature systems when the raw material is to be transported outside of the high temperature area for processing. It allows bearing members between movable parts to be located outside the high temperature zone and consequently allows a longer useful life of the feeder and the use of less expensive materials outside the hot zone in its fabrication. The feeder system is also designed for accurate, steady flow rates of raw materials to the processing area and is especially designed for vacuum system use.

In an apparatus for growing single crystals from the melt, the purity of the raw material is critical. Therefore, the whole system is held under an air-evacuated atmosphere to prevent raw material particles from absorbing vaporous impurities. The temperature of the raw material is also raised considerably to aid in removing impurities and also to provide a smaller difference in temperature between the melt and the replenishing particulate raw material so that smaller thermal gradients will be produced when the material is fed to the melt.

Figure 1:
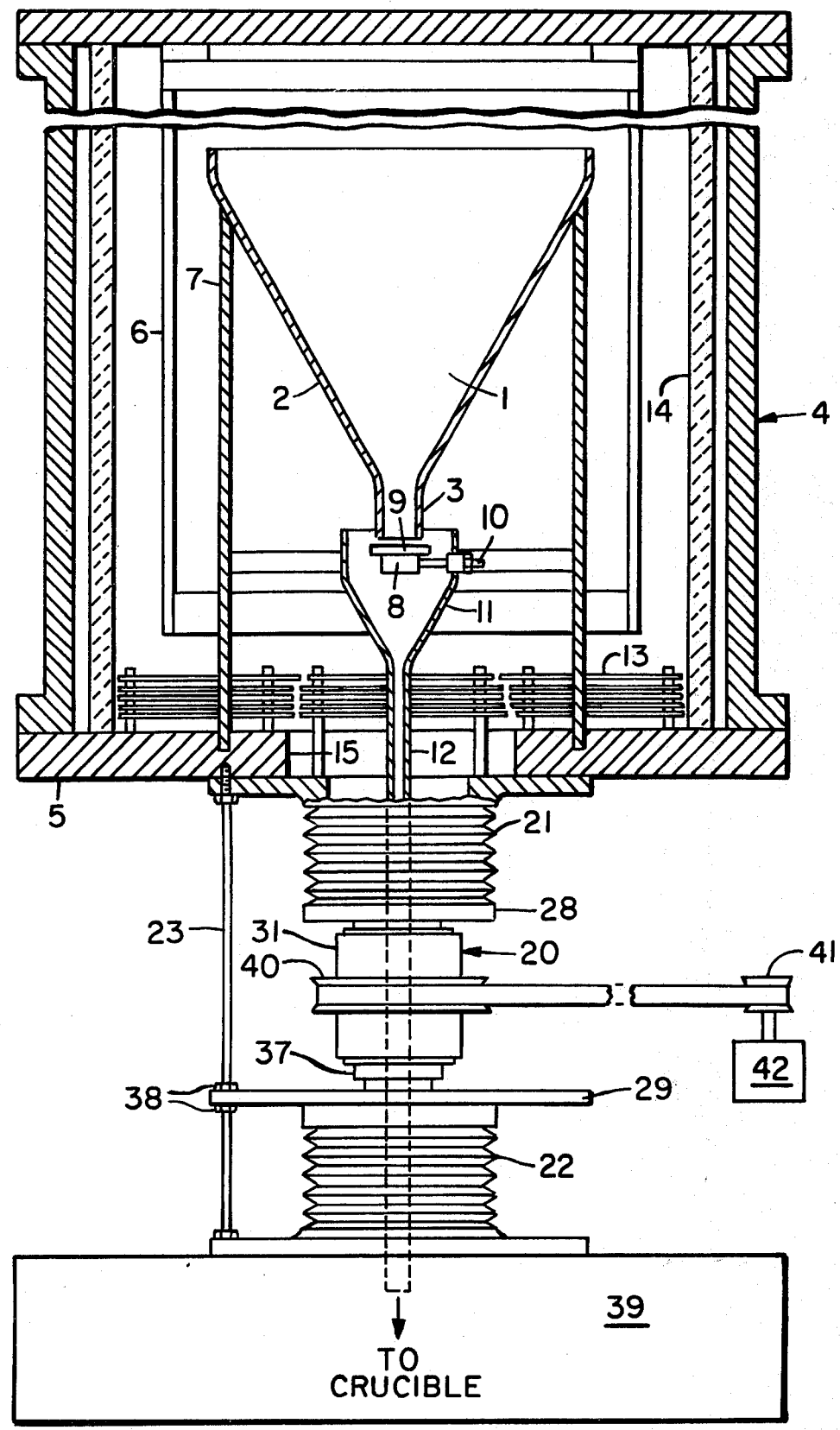
FIG. 1 is a view of the entire feeder system of the present invention showing its attachment to the crystal growing furnace at the bottom of the Figure.

In FIG. 1 a feeder mechanism of the present invention for delivering raw material to a crystal growing apparatus is shown. The preheat furnace 4 is shown as a closed cylindrical structure with electrical furnace elements 6, which would be conventionally attached to energizing means (not shown), and a water-cooled bottom plate 5 having a circular hole 15 centered about the longitudinal axis of the furnace cylinder. Conventional thin refractory metal heat shields 13 are provided along the bottom of the furnace to reduce radiation losses through the bottom hold and conventional refractory furnace muffle 14 is provided to reduce heat losses through the furnace sidewalls.

The actual feeder mechanism is partially contained within the preheat furnace 4 and is fabricated from materials which can withstand the operating temperatures, such as the refractory metals, molybdenum, tungsten or platinum. The raw material hopper 2 is filled with raw material 1 and is supported by support rods 7 fixed to the furnace bottom 5. The hopper is substantially centered in the furnace and has an outlet opening 3 disposed substantially axially with the furnace longitudinal axis. A funnel 11 having a downwardly extending conduit 12 is positioned axially with the outlet opening and is adapted to receive raw material discharged from the hopper. The conduit 12 extends through a hole in the heat shields 13 and out of the preheat furnace through the bottom hole 15. The conduit either itself extends to the crystal growing furnace or a tubular extension may be fixed thereto to extend to the crystal growing furnace.

A disc shaped metering means or disc 9 may be fixed directly to the funnel 11 or may be fixed to a disc support 8 which is then secured to the funnel by means of a mounting bolt 10. In either case, the disc is disposed concentrically with the funnel 11 and the outlet opening 3 and the distance between the outlet opening and the disc experimentally determined for the particular raw material 1. The disc 9 preferably has a surface area larger than the area of the outlet opening for best operation of the feeder. It has been found that the spacing of the disc from the outlet opening, the size of the disc (for given outlet opening), and the speed of rotation of the disc affect the flow rate of the particular raw material.

The funnel 11 and the disc 9 are rotated by the action of a rotation means 20 on the conduit 12. The rotation means is in a relatively cool region of the system between the preheat furnace 4 and the crystal growing furnace 39 (represented schematically as a box for simplicity in FIG. 1). The funnel rotation means 20 is separated from the bottom plate 5 of the raw material preheat furnace 4 by a longitudinally extendable upper bellows 21 and is separated from the crystal growing furnace 39 by a longitudinally extendable lower bellows 22; the entire assembly between the preheat furnace 4 and the crystal growing furnace 39 being made gas tight with appropriate placement, as will be understood in the art, of metal or elastomer sealing rings between the preheat furnace 4, upper bellows 21, funnel rotation means 20, lower bellows 22 and crystal growing furnace 39. Many of the parts below the preheat furnace, and especially the bellows, may advantageously be made of a stainless steel.

Figure 2:
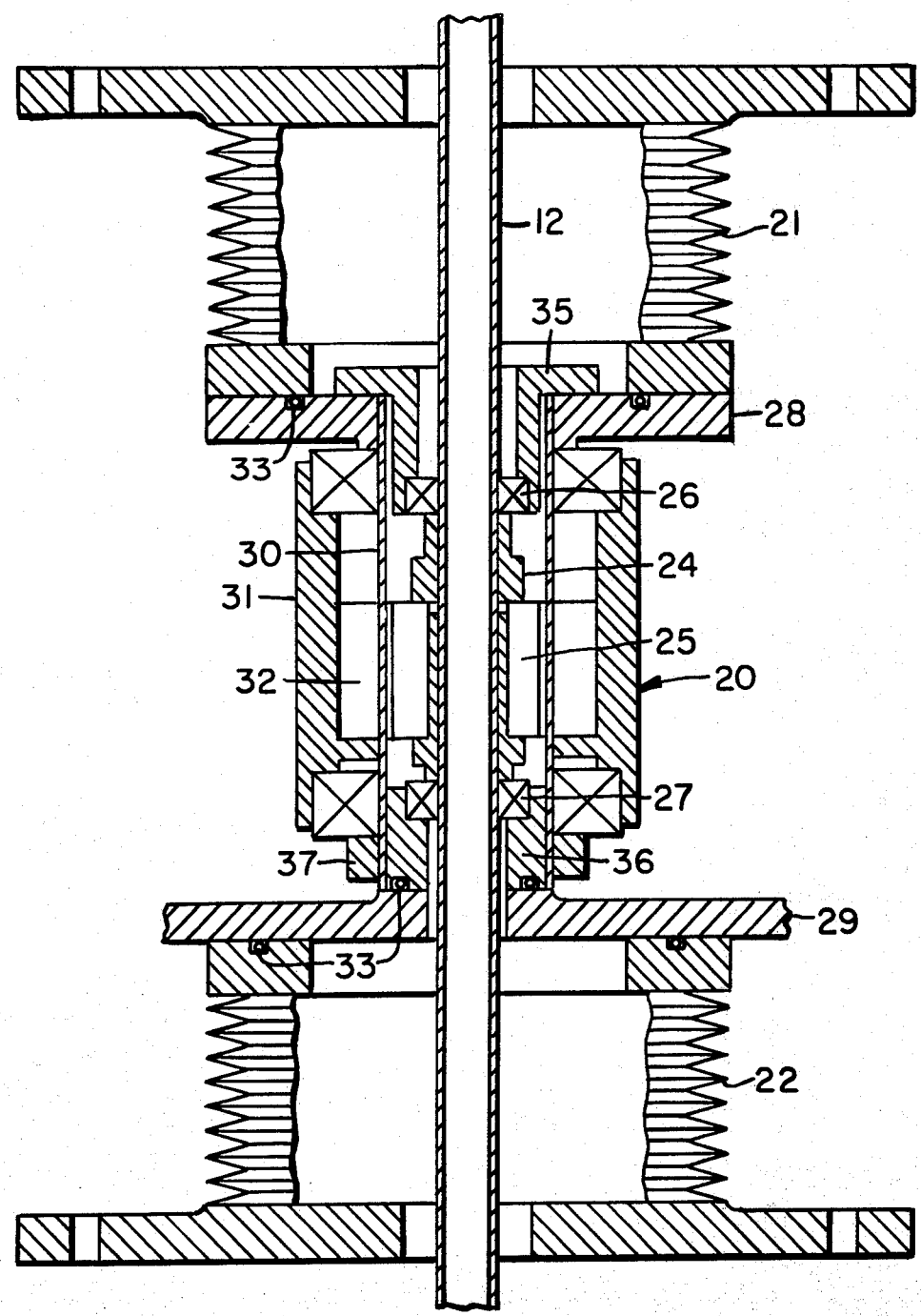
FIG. 2 is an enlarged view of the rotation means of FIG. 1.

In FIG. 2, the cross-sectional view of the funnel rotation means 20 is enlarged along with the bellows 21 and 22 and includes a sleeve portion 24 surrounding the funnel conduit 12 and fixed, for example with set screws, in relation thereto for rotation therewith. The sleeve portion 24 has outwardly extending shoulders adapted to receive and hold a ring-shaped inner magnet 25 for rotation with the sleeve 24 and the conduit. The sleeve comprises two cylindrical pieces for ease of assembly with the conduit and the magnet. The magnet is preferably a ceramic sleeve type permanent magnet such as may be obtained from Stackpole Carbon Co. under the trademark CERAMAGNET, in which multiple magnetic poles extending axially and parallel are magnetized on the outer surface of the magnet.

Sleeve portion 24, at its upper and lower ends respectively, bears on the edges of the inner races of ball bearings 26 and 27, and rotates in conjunction with such races. The outer races of ball bearings 26 and 27 are fixed, at their upper and lower edges respectively, in relation to bearing collars 35 and 36, each extending around the outside circumference of its respective race. Bearing collar 35 is additionally fixed to and supported by the internal upper surface of upper flange 28 of the rotational means which in turn joins and seals the upper bellows 21. Bearing collar 36 is fixed to lower flange 29 of the rotational means which joins and seals the lower bellows 22.

Cylinder wall 30 is sealably fixed to and extends between the upper flange 28 and the lower flange 29 and houses the rotatable sleeve portion 24, inner magnet 25, bearings 26 and 27, and bearing collars 35 and 36. The cylinder wall is preferably in a closely spaced apart relation with the inner magnet. The joints between opposing surfaces and flanges of the bellows and rotation means are made gas tight with the appropriate placement of elastomer O-ring seals 33.

An outer ring-shaped magnet 32 similar to the inner magnet but having its inside surface magnetized, surrounds the external surface of the cylinder wall 30 in a radially outward position from or at about the same height as the inner annular magnet 25. The outer magnet is rotatably mounted in a closely spaced apart relation with the cylinder wall by a bearing 31 with an internal annular recess adapted to accept the outer magnet. As shown in FIG. 1, the magnet may be rotated by any convenient means, for example, by means of an electric motor 42 and a belt and pulley system such that pulley 40 surrounding the bearing 31 is driven by a smaller pulley 41 fixed to the motor shaft. The inner races of bearing 31 are fixed with respect to the cylinder wall and positioned by the upper flange 28 on the bearing upper end and by a retaining ring 37 on the bearing lower end.

Again referring to FIG. 1, the funnel rotation means is also height adjustable to raise or lower the funnel 11 and the disc 9 in the preheat furnace and thereby increase or decrease the spacing between the disc and the raw material hopper outlet opening 3. The height adjustment means as shown in FIG. 1 includes the upper and lower bellows and a threaded rod 23 which extends from the preheat furnace side of the upper bellows through a hole in the lower flange 29 and to the crystal growing furnace side of the lower bellows. The lower flange 29 is slideable upward or downward on the threaded rod thereby raising or lowering the whole funnel rotation means as one bellows extends and the other contracts. The position of the lower flange is then held stationary during use by means of lock nuts 38 tightened above and below the lower flange.

The lower bellows 22 is sealed to the crystal growing furnace 39 in an advantageous position which allows the funnel conduit 12 to extend directly to the crucible or preferably to deposit the raw material into a second funnel means (not shown) within the crystal furnace which then directs the raw material to the crucible. The latter arrangement allows the funnel assembly of the present invention to be raised and lowered slightly without affecting the ultimate position of delivery of the raw material to the crucible by the independent second funnel.

Figure 3:
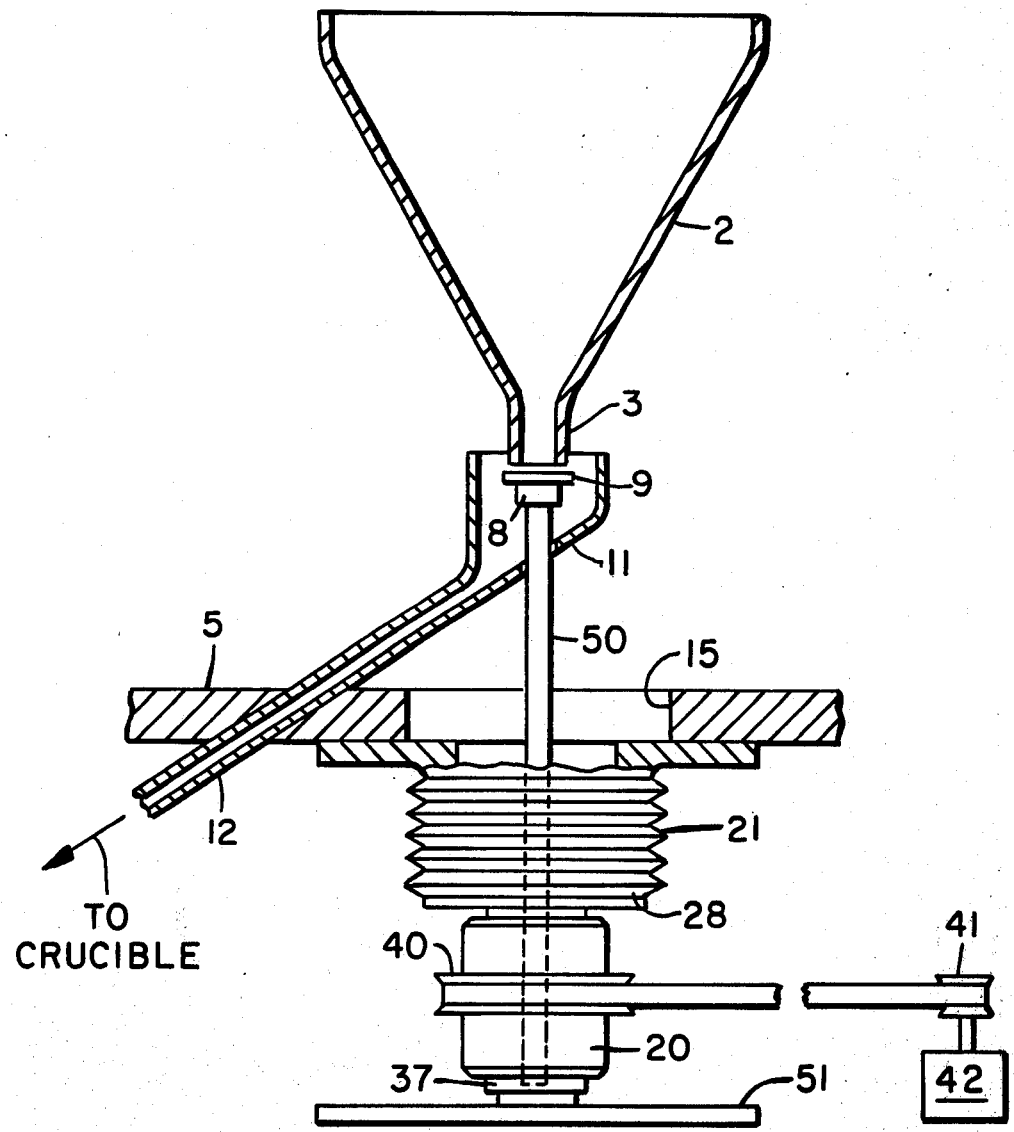
FIG. 3 is an alternative embodiment of the feeder mechanism of the invention.

The feeder mechanism shown in FIG. 3 is an alternative design for the feeder of FIG. 1. FIG. 3 shows a breakaway of the bottom plate of the furnace assembly shown in FIG. 1 in combination with the alternative feeder and with consistent reference numbering to FIG. 1 showing the hopper 2, hopper outlet opening 3, metering means 9, disc support 8, funnel 11, funnel conduit 12, furnace bottom 5, furnace bottom hole 15, upper bellows 21, upper flange 28, rotation means 20, retaining ring 37, pulleys 40 and 41, and motor 42. In addition, FIG. 3 shows the adaptations made to accommodate the alternative design in which the funnel for collecting and transporting particulate material to the crucible is stationary and the metering means is fixed to and rotated with a solid rod 50 extending from the bottom of the metering means, through an opening in the sidewall of the funnel and into the rotation means 20. Since the solid rod 50 being rotated by the rotation means does not need to extend to the crystal furnace, the lower flange 29 of the apparatus of FIG. 1 has been replaced by a solid plate 51 which seals the above apparatus and is supported by appropriate means.

The funnel conduit extends through a gas-tight seal in a second opening in the furnace bottom. A flexible hose member may be joined to the funnel conduit outside of the pre-heat furnace and may extend and carry the particulate material to the crystal growing furnace.

The present feeder design provides a very constant method of delivering particulate material. In addition, the rate of delivery is closely controllable and adaptable to changes in particle size of the raw material.

Figure 4:
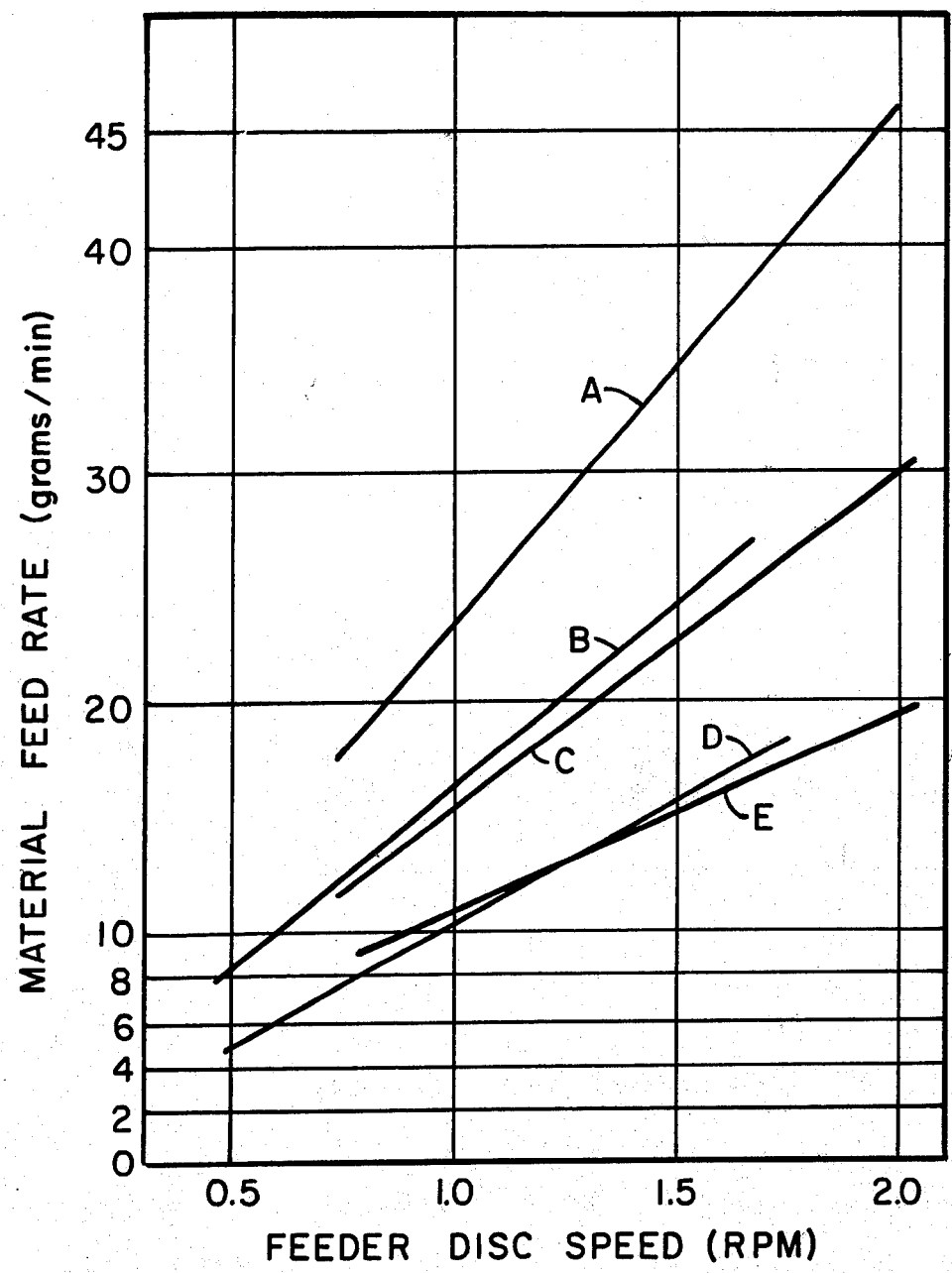
FIG. 4 is a graphic illustration of the factors affecting the rate of material delivery using a prototype of the disclosed feeder of FIG. 1.

The rate of delivery has been experimentally found using a prototype of the FIG. 1 feeder consisting of the hopper, disc, funnel and bearings. The rate has been determined for various speeds of disc rotation, sizes of disc and spacing between the disc and the hopper outlet opening, to show the degree of control the operator has over the delivery of the material. In FIG. 4, the results of the experimentation are graphically displayed. The curves represent the rates of delivery in grams per minute for various speeds (revolutions per minute) of rotation of the disc. The size of the disc and spacing of the disc from the outlet opening are shown below. The inside diameter of the hopper outlet opening was 1 1/16 inches (2.7 cm).

|  | Disc Diameter (centimeters) | Spacing between disc and outlet (centimeters) |
| --- | --- | --- |
| Curve A | 3.81 | 0.715 |
| Curve B | 3.81 | 0.556 |
| Curve C | 4.44 | 0.715 |
| Curve D | 4.44 | 0.556 |
| Curve E | 4.44 | 0.556 |

The material used in producing curves A-D was a crushed boule of polycrystalline alpha-alumina with a particle size of about −8+20 Tyler mesh. The material used in generating curve E was a sintered alpha-alumina product with substantially spherical particles and a size of about −8+20 Tyler mesh. The results show that accurate control over the raw material feed rate can be realized by controlling the speed of rotation, disc size and disc spacing.

I claim:
1. A particulate raw material feeder mechanism for delivering the material at a constant rate to a processing area, which mechanism comprises:
   A. a raw material hopper having an inlet opening at the top thereof for receiving raw material and an outlet opening at the bottom thereof for discharging raw material,
   B. a rotatable funnel member located substantially axially beneath the hopper outlet opening for receiving raw material discharged therefrom, and including conduit means extending axially down- wardly from the funnel member for transporting discharged raw material a distance away from the hopper to the processing area, C. metering means mounted on the funnel member for rotation therewith and for rotation relative to the hopper outlet opening, positioned substantially axially to the outlet opening and above the receiving means, and having a flat upper surface positioned at such a distance below the hopper outlet opening and being of such size relative thereto that when the metering means is stationary, the raw material falls from the hopper and accumulates on the metering means upper surface, and when rotating, the raw material falls from the hopper to the metering means upper surface and steadily flows to an edge of the upper surface, thence constantly to the funnel member, and D. rotation means for rotating the metering means and rotatably supporting the funnel member.

2. The feeder of claim 1 wherein the rotation means comprises:

A. a sleeve portion fixed to the funnel conduit for rotation therewith and having shoulder portions forming an annular space between such portions, B. an inner ring-shaped magnet axially aligned with the conduit and held in the annular space by the sleeve shoulder portions for rotation therewith, C. means for rotatably supporting the sleeve portion, inner magnet and conduit, D. a fixed cylindrical housing member enclosing the sleeve, inner magnet and support means and positioned in a closely spaced apart relationship with the inner magnet, E. means for supporting the housing member, F. a rotatable, outer, ring-shaped magnet surrounding the housing member in a closely spaced apart relationship therewith, G. means for rotatably supporting the outer magnet at about the same height as the inner magnet such that rotation of the outer magnet will cause rotation of the inner magnet, sleeve portion and conduit, and H. means for rotating the outer magnet.

3. The feeder of claim 2 wherein the means for rotatably supporting the sleeve portion, inner magnet and conduit comprises upper and lower ball bearings, the inner races of which bear on the upper and lower ends, respectively, of the sleeve portion and the outer races of which are fixed with respect to the housing member.

* * * * *